United States Patent [19]
Mate

[11] Patent Number: 4,764,924
[45] Date of Patent: Aug. 16, 1988

[54] TEST INTERFACE FOR AN MOS TECHNOLOGY INTEGRATED CIRCUIT

[75] Inventor: Jean-Luc Mate, Toulouse, France

[73] Assignee: Bendix Electronics S.A., Toulouse, France

[21] Appl. No.: 918,168

[22] Filed: Oct. 10, 1986

[30] Foreign Application Priority Data

Oct. 16, 1985 [FR] France ................. 85 15340

[51] Int. Cl.$^4$ ............................................. G01R 31/28
[52] U.S. Cl. .................................... 371/15; 324/73 R
[58] Field of Search ....................... 371/15; 324/73 R; 307/350, 360, 362, 363, 451

[56] References Cited

U.S. PATENT DOCUMENTS

| | | | |
|---|---|---|---|
| 4,229,670 | 10/1980 | Thommen | 307/361 X |
| 4,336,495 | 6/1982 | Hapke | 324/73 R X |
| 4,398,146 | 8/1983 | Draheim | 324/73 PC X |
| 4,658,156 | 4/1987 | Hashimoto | 307/350 |

Primary Examiner—Jerry Smith
Assistant Examiner—Robert W. Beausoliel
Attorney, Agent, or Firm—Russel C. Wells; Markell Seitzman

[57] ABSTRACT

This interface enables the integrated circuit with which it is associated to be placed in a test configuration by applying to its test input terminal (2) a voltage higher than the power supply voltage ($V_{cc}$) of the circuitry. In the rest state, the interface then supplies a low logic level to its output terminal (5). If the test command voltage is applied, this level changes state.

The interface comprises, in particular, two transistors ($M_1$, $M_2$) of opposite types of conductivity which are fed by a constant current source (10, $M_5$, $M_6$). The interface switches over when the input transistor ($M_1$) is put into the conducting state by the test command voltage so as to divert a fraction of the current flowing in the second transistor ($M_2$).

The input terminal (2) can at the same time be a functional input terminal of the integrated circuit.

6 Claims, 3 Drawing Sheets

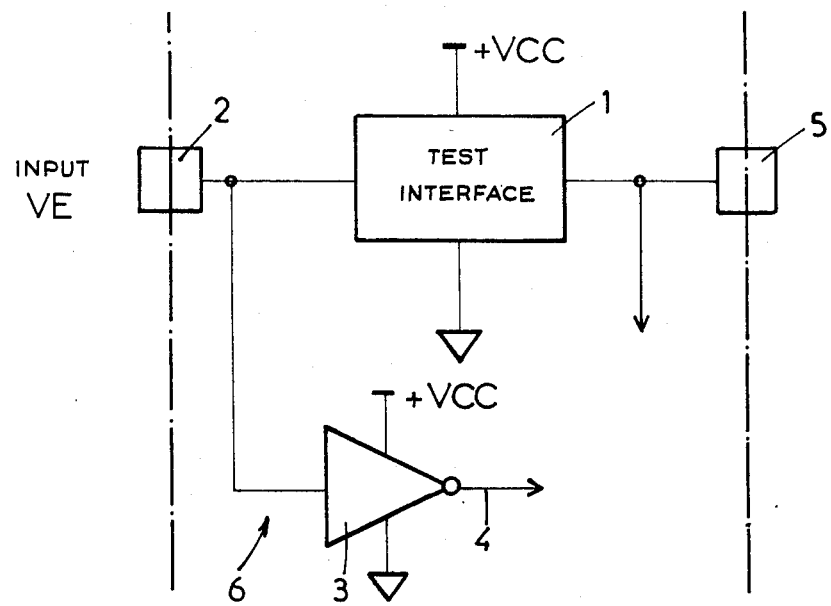
FIG.1
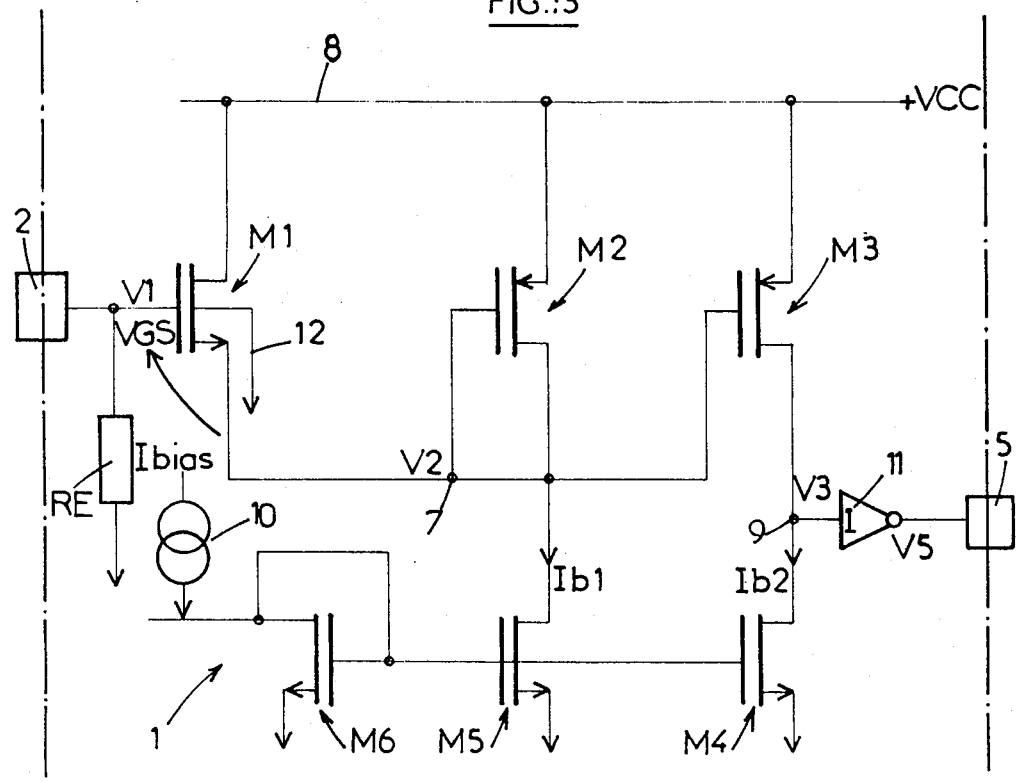
FIG.:3

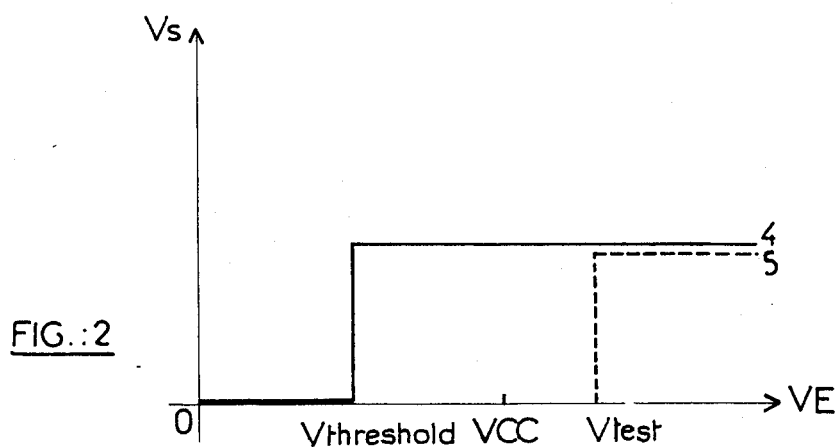
FIG.:2
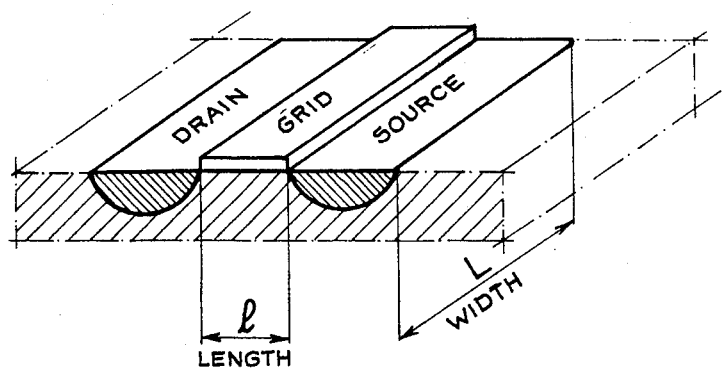
FIG.:4A
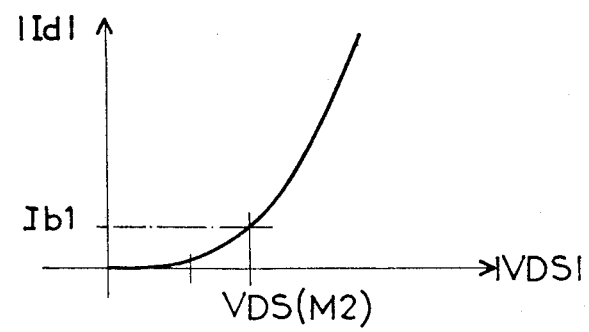
FIG.:4B

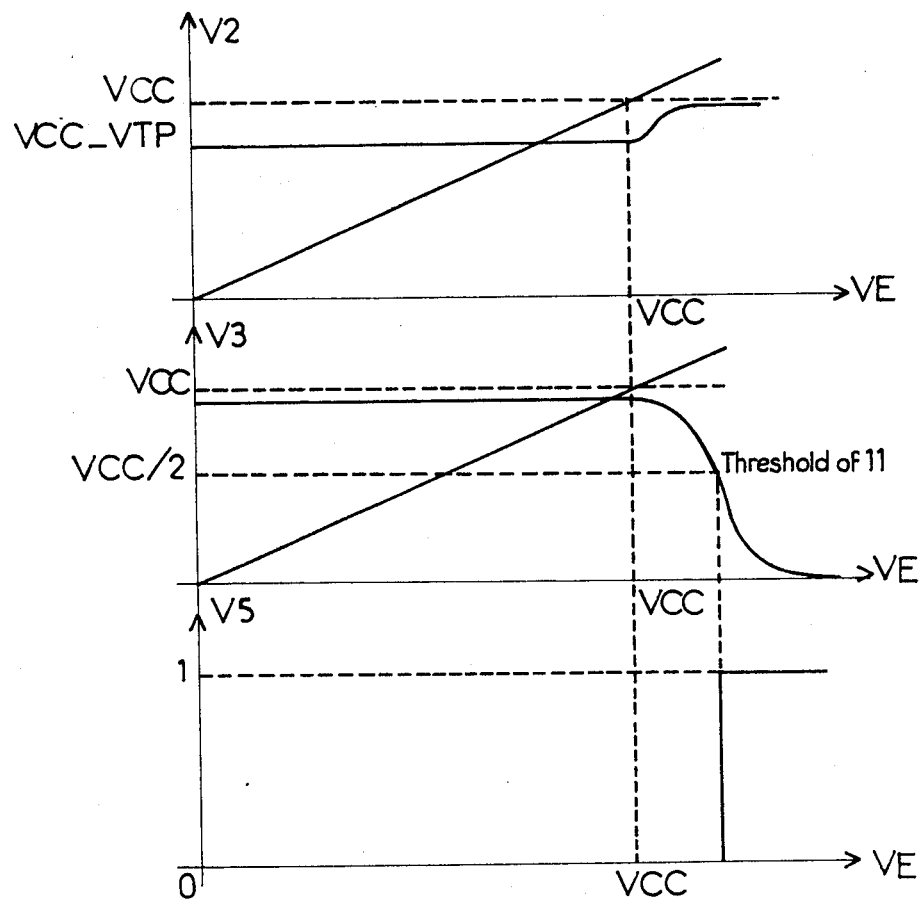
FIG.:5
FIG.:6
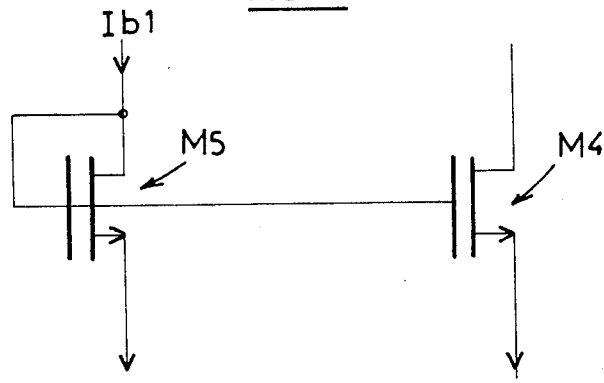

TEST INTERFACE FOR AN MOS TECHNOLOGY INTEGRATED CIRCUIT

The present invention relates to integrated circuits produced using MOS technology.

It is known that integrated circuits are very often provided with a test pin which, when it is activated, makes it possible to place the integrated circuit in a test configuration.

It is therefore an object of the invention to provide an integrated interface connected between the test pin and the integrated circuit and which makes it possible to guarantee a high immunity to incorrect operations, i.e. avoiding the possibility of the test mode intervening by accidental connection of the test pin to the neighbouring pins of the integrated circuit. The invention also aims at providing such an interface which is reliable, requires only a minimal number of components for its production, and has a low power consumption.

According to the present invention there is provided a test interface for a MOS type integrated circuit including at least one function command input terminal, a test command input terminal and a test output terminal, characterized in that the interface comprises a parallel circuit with head-to-tail connection of the source-drain paths of two MOS transistors of opposite types of conductivity, this parallel circuit being connected between a power supply voltage line of the integrated circuit and a potential point which is connected to an approximately constant current source, the gate of the first transistor being connected to the test command input terminal, while the gate of the second transistor is connected to the said potential point, and in that the interface also includes means of detection capable, in response to a variation in the voltage on the potential point due to the application of a voltage to the test input terminal higher than the power supply voltage, of providing a logic transition on the test output terminal.

An interface having these features has the advantage of necessitating a test mode command logic level which is higher than the maximum power supply voltage of the circuit, which therefore eliminates any risk of incorrect operations. In addition, the behavior of this interface is largely controlled by the relative dimensions of the components so that its functioning depends on the printing accuracy with which the circuit can be produced. Now, this accuracy is very high in the current state of MOS technology.

The invention will be better understood with the help of the following description of two embodiments, referring to the accompanying drawings, given solely by way of example, in which:

FIG. 1 is a block diagram showing how the test interface according to the invention is included in an integrated circuit;

FIG. 2 is a curve of the output states of the circuit in FIG. 1 as a function of the voltage VE applied to its input terminal;

FIG. 3 is a detailed diagram of a first embodiment of the test interface according to the invention;

FIG. 4A is a diagrammatic representation of a MOS transistor illustrating the definition of its form factor;

FIG. 4B is a characteristic curve of the drain current $I_d$ as a function of the drain/source voltage $V_{ds}$ of an MOS transistor in common gate-drain connection;

FIG. 5 shows three curves of voltages appearing in the circuit of FIG. 3 during a transition taking it into the test configuration; and FIG. 6 is a partial circuit diagram of another embodiment of the invention.

FIG. 1 is the general diagram of a integrated circuit provided with a test interface 1 according to the invention.

This interface 1 is connected to a terminal 2 in parallel with a normal functional input stage 3 of the integrated circuit. Stage 3 formed by an inverter has a functional output 4 connected to other parts (not shown) of the integrated circuit. The output of the interface 1 can be connected to a test output terminal 5 and controls the transition into test mode of the internal functional parts of the integrated circuit. The integrated circuit is designated in its entirety by the reference numeral 6.

The input terminal 2 serves both to activate the functional input stage 3 and to place the integrated circuit 6 in its test configuration. Thus the invention enables, by means of the same terminal 2, the selective application of a functional signal or a test signal to the integrated circuit 6. It should be noted, however, that it would be possible to provide separate test input and functional input terminals if appropriate.

FIG. 2 shows how the activation of outputs 4 and 5 can be selected by means of the interface 1 being present. For a certain input voltage $V_E$ applied to the terminal 2, i.e. a voltage $V_{threshold}$ equal to the switchover voltage of the inverter 3, a transition appears at the functional output 4 which can be appropriately interpreted as any command whatsoever of the integrated circuit 6.

If, on the other hand, a voltage $V_{test}$, greater than the power supply voltage $V_{cc}$ of the circuit is applied to input 2, a transistion appears on the test output 5 making it possible to place the integrated circuit 6 in its test configuration. The logic level of output 4 does not, of course, vary in this case. FIG. 2 shows the transition of stage 3 in full line, and the transition of the interface 1 in dotted lines.

FIG. 3 is a more detailed diagram of the test interface 1 produced using CMOS technology. The input 2, which is presumed to be at voltage $V_1$ is connected to the gate of a first transistor $M_1$ which, in this example, is of enhancement N channel type. The source of this transistor is connected to a potential point 7 whose voltage will be called $V_2$ hereinafter. The drain of transistor $M_1$ is connected to a line 8 to which is applied the power supply voltage $+V_{cc}$.

The transistor $M_1$ works in conjunction with another transistor $M_2$ of opposite conductivity type, in this case therefore an enhancement P channel. The gate of transistor $M_2$ is connected to the potential point 7, its source is connected to line 8 and its drain is also connected to potential point 7. The drain-source paths of transistors $M_1$ and $M_2$ therefore form a head-to-tail parallel circuit.

A third transistor $M_3$ mounted in mirror-image configuration with respect to transistor $M_2$ is an enhancement P channel type transistor, i.e. having the same type of conductivity as transistor $M_2$. The gate of transistor $M_3$ is connected to potential point 7, its source to line 8 and its drain to a potential point 9 which is presumed to be at voltage $V_3$.

A current source 10 within the integrated circuit 6 supplies a current $I_{bias}$ to a mirror-image configuration of three transistors $M_4$, $M_5$, $M_6$, all of conductivity type identical to that of transistor $M_1$. Thus the drain of transistor $M_4$ is connected to potential point 9, its source is connected to ground and its gate is connected in common to the gates of transistors $M_5$ and $M_6$.

The sources of the latter are connected to ground. The drain of transistor $M_5$ is connected to potential point 7 and that of transistor $M_6$ is connected to the current source 10 and to its own grid.

Potential point 9 is connected via an inverter 11 to output 5 which provides the test logic signal.

Finally, a resistor RE connected between the gate of transistor $M_1$ and ground is provided to adjust the input impedance of the assembly. It should be noted that the choice of a low value for this resistor makes it posssible to avoid any transition into test mode when pin 5 is not connected.

The functioning of this interface is as follows:

The $I_{bias}$ current 10 is copied in transistors $M_5$ and $M_4$ in the same form as in transistor $M_6$ due to the mirror-image connection of these three transistors. In transistors $M_4$ and $M_5$ there flows a current which depends on the form factor $K_f$ of the transistors in question. The definition of this form factor appears in FIG. 4A; it is equal to the quotient of the width divided by the length of the gate: $K_f = L/l$. Consequently:

$$\frac{K_f(M_5)}{K_f(M_5)} = \frac{K_f(M_6)}{K_f(M_4)} = \frac{I_{bias}}{I_{b1}}$$

In other words, transistors $M_4$ and $M_5$ have approximately the same form factor $K_f(M_4) \# K_f(M_5)$ As the $I_{bias}$ current is of constant value, there results a current $I_{b1}$, also constant, flowing in transistor $M_5$.

As long as transistor $M_1$ is not conducting, because an insufficient voltage is applied to its gate, this current $I_{b1}$ passes through the enhancement P channel MOS transistor $M_2$ in its entirety. This transistor has its gate connected to its drain so that the shape of its $I_d = f(V_{ds})$ characteristic (FIG. 4B) is approximately that of a diode. The current $I_{b1}$ therefore imposes at the terminals of transistor $M_2$ a voltage drop $V_{DS}(M_2) \# V_{TP}$, $V_{DS}$ being the drain-source voltage and $V_{TP}$ being the threshold voltage of a P channel MOS transistor.

The result of this is that the voltage $V_2$ at potential point 7 is equal to $V_{cc} - V_{DS}(M_2) \# V_{cc} - V_{TP}$, is a voltage very close to the power supply voltage $V_{cc}$.

As transistors $M_2$ and $M_3$ are connected as a current mirror, a current $I_{M3}$ tends to be established in transistor $M_3$ in the form:

$$I_{M3} = I_{b1} \cdot \frac{K_f(M_3)}{K_f(M_2)}$$

If the transistors are dimensioned such that:

$$\frac{K_f(M_3)}{K_f(M_2)} > 1 \text{ then } I_{M3} > I_{b1}.$$

Considering the characteristic $I_d = f(V_{DS})$ of transistor $M_3$ and the value of the voltage $V_2$, the latter finds itself in the linear region of its current-voltage characteristic. As the ratio $$\frac{K_f(M_3)}{K_f(M_2)}$$

is chosen distinctly greater than 1 and the current $I_{M3}$ in transistor $M_3$ is equal to current $I_{b2}$ in transistor $M_4$, these two transistors being connected in series, transistor $M_3$ tends to impose in transistor $M_4$ a current greater than that assigned to it due to its mirror-image connection with transistors $M_5$ and $M_6$. Because of this, transistor $M_4$ therefore functions in the saturation region of its characteristic $I_d = f(V_{DS})$ and a state of equilibrium is reached for a current $I_{b2}$ passing through transistors $M_3$ and $M_4$ which is close to $I_{b1}$. The voltage $V_3$ established at potential point 9 is therefore then close to the power supply voltage $V_{cc}$.

By choosing a switch-over threshold for inverter 11 ($V_{cc}/2$) which is close to half the power supply voltage, this inverter thus delivers a logic 0 level at its output. This situation occurs as long as the voltage $V_1$ applied to the gate of transistor $M_1$ remains less than or equal to the power supply voltage $V_{cc}$. (The left hand section of the curves in FIG. 5).

The substrate or case of transistor $M_1$ is connected to ground (connection 12 in FIG. 3). Its source is connected to potential point 7 which, as has just been seen, is very close to the power supply voltagee $V_{cc}$:

$$V_2 \# V_{cc} - V_{TP}$$

(with for example $V_{TP} = 0.7$ V for $V_{cc} = 5V$)

The threshold voltage of transistor $M_1$ is therefore equal to $$V'_{TN} = V_{TN} + \gamma(\sqrt{V_2 + 0} - \sqrt{0}),$$

where:

$V_{TN}$ is the threshold voltage of an N channel MOS transistor;

$\gamma$ is the substrate effect coefficient between 0.2 and 0.8 and typically 0.5;

0 is a constant associated with CMOS manufacturing technology and equal to about 0.6 V for current technologies.

The conduction threshold of transistor $M_1$ is therefore positioned at $V_E = V_2 + V'_{TN}$ from which is obtained:

$$V_E = V_{cc} - V_{TP} + V_{TN} + \gamma(\sqrt{V_2 + 0} - \sqrt{0})$$

or, $V_E = V_{cc} + \Delta V_{TN}$ for $V_{TP} \# V_{TN}$ and $$\gamma(\sqrt{V_2 + 0} - \sqrt{0}) = \Delta V_{TN}.$$

Thus, as long as the voltage on the gate of transistor $M_1$ remains less than or equal to $V_{cc}$, the state of equilibrium described above is maintained. The voltage at terminal 2 can therefore vary within this range for the functional control of the integrated circuit without there being any risk of this integrated circuit being placed in its test configuration.

The case will now be examined in which terminal 2 receives a voltage higher than the power supply voltage $V_{cc}$ (the right hand section of the curves in FIG. 5). In this case, transistor $M_1$ becomes conducting and diverts part of the current $I_{b1}$ passing through transistor $M_2$. This lowering of the current passing through transistor $M_2$ causes, by means of the mirror-image structure, a reduction in the current passing through transistor $M_3$. Simultaneously, voltage $V_2$ at potential point 7 progressively rises towards the voltage $V_{cc}$ which causes a reduction in the gate-source voltage of transistor $M_3$ which therefore passes from its linear region into its saturated region.

As the drain-source paths of transistors M3 and M4 are connected in series, it is transistor M3 and no longer than mirror-image structure of transistors M4, M5 and M6 which imposes the current in transistor M4. As the gate-source voltage $V_{GS}$ of transistor M4 is not changed, the reduction in the current $I_{b2}$ which passes through it causes it to unsaturate. Transistor M4 therefore passes into the linear region of its characteristic $I_d=f(V_{DS})$ and its drain-source voltage $V_{DS}$ falls, i.e. voltage $V_3$ falls towards ground potential as shown in FIG. 5.

Thus, for a current of sufficient value diverted by transistor M1 from transistor M5, the voltage at potential point $V_3$ becomes lower than the switch-over threshold $V_{cc}/2$ of the inverter 11, which makes output 5 of the interface pass from its logic 0 level to its logic 1 level as shown in FIG. 5.

The maximum value of the threshold voltage for which the interface switches over is determined by the maximum permissible voltage on the gate of transistor M1, a maximum voltage which can be chosen moreover by adapting of the form factor of the transistor.

FIG. 6 shows a variant of the interface according to the invention that can be used in the case in which the integrated circuit 6 does not itself include a current source 10. It can be seen that it is then sufficient to connect the gate and drain of transistor M5 together, it being then possible to omit transistor M6. The current $I_{b1}$ will no longer be strictly constant, but this does not alter the principle of operation of the interface 1.

An undeniable advantage of the test interface described is that it does not necessitate the addition of a specific test input pin to the integrated circuit in which it is included as this interface can be connected in parallel with a normal functional input stage of this circuit (FIG. 1).

In fact, the threshold of this normal functional input stage is located between between zero and the supply potential $V_{cc}$ of the integrated circuit. For this input potential range, the test interface is inactive and does not disturb the functioning of the integrated circuit. By taking the input voltage $V_E$ on terminal 2 above the power supply voltage, $V_{cc}$, the test interface is activated without changing the logic level of input stage 3.

It will be noted that the two states that can be taken by the interface largely depend on the form factors of the MOS transistors used, i.e. essentially on the dimensioning of the gates which can be carried out with a very high accuracy. It is therefore easy to control the behaviour of the interface.

It will also be noted that although the circuit that has just been described is intended to be produced using CMOS technology, the invention is not limited to this specific technology nor to the specific types of conductivity of the transistors described.

I claim:

1. A test interface for an MOS type integrated circuit including at least one function command input terminal, a test command input terminal and a test output terminal, characterized in that the interface comprises:

a parallel circuit with head-to-tail connection of the source-drain paths of first and second MOS transistors of opposite types of conductivity, said parallel circuit being connected between a power supply voltage line of the integrated circuit and a potential point ($V_2$), the gate of said first transistor being connected to the test command input terminal and the gate of said second transistor being connected to said potential point;

a third transistor (M5) having its drain-source path between said potential point and ground;

a constant current source connected to the gate of said third transistor for supplying current to said second transistor when said first transistor is not conducting;

detection means including a series cicruit between said power supply voltage and ground of the drain-source paths of a fourth transistor (M3) and a fifth transistor (M4) having opposite types of conductivity, whose common connection point is connected to the test output terminal, said fourth and fifth transistors forming a mirror-image current with said second (M2) and third (M5) transistors respectively, the gate of said fourth transistor being connected to said potential point for responding to the conduction of said parallel circuit, the gate of said fifth transistor being connected to the gate of said third transistor for receiving current from said constant current source;

said series circuit responding to a voltage at the test input terminal higher than the power supply voltage, for providing a logic transition on the test output terminal when said first transistor is conducting.

2. A test interface according to claim 1, characterized in that the test command input terminal is the same terminal as the function command input terminal of the integrated circuit.

3. A test interface according to claim 1, characterized in that the test command input terminal is connected to ground via an input impedance matching resistor.

4. A test interface according to claim 1, characterized in that the form factors and of said second and of said third transistors are chosen in order to satisfy the following expression:

$$\frac{K_f(M3)}{K_f(M2)} > 1$$

where said form factor is the ratio of the width and the length of the gate, $K_f(M2)$ is the form factor of said second transistor and $K_f(M3)$ is the form factor of said third transistor.

5. A test interface according to claim 4, characterized in that said fourth and fifth transistors have approximately the same form factor.

6. A test interface according to claim 1, characterized in that said current source is part of said integrated circuit.

* * * * *